United States Patent
Suzuki

(10) Patent No.: US 9,346,625 B2
(45) Date of Patent: May 24, 2016

(54) WORK SYSTEM FOR SUBSTRATES AND WORKING MACHINE

(75) Inventor: Junichi Suzuki, Toyoake (JP)

(73) Assignee: FUJI MACHINE MFG. CO., LTD., Chiryu (JP)

( * ) Notice: Subject to any disclaimer, the term of this patent is extended or adjusted under 35 U.S.C. 154(b) by 0 days.

(21) Appl. No.: 14/414,928

(22) PCT Filed: Jul. 17, 2012

(86) PCT No.: PCT/JP2012/068070
§ 371 (c)(1),
(2), (4) Date: Jan. 15, 2015

(87) PCT Pub. No.: WO2014/013537
PCT Pub. Date: Jan. 23, 2014

(65) Prior Publication Data
US 2015/0223370 A1  Aug. 6, 2015

(51) Int. Cl.
| | |
|---|---|
| *B65G 43/10* | (2006.01) |
| *H05K 13/08* | (2006.01) |
| *B65G 37/00* | (2006.01) |
| *B65G 43/00* | (2006.01) |
| *B65G 43/08* | (2006.01) |
| *H05K 13/04* | (2006.01) |
| *H05K 13/00* | (2006.01) |

(52) U.S. Cl.
CPC ............... *B65G 43/10* (2013.01); *B65G 37/00* (2013.01); *B65G 43/00* (2013.01); *B65G 43/08* (2013.01); *H05K 13/04* (2013.01); *H05K 13/08* (2013.01); *B65G 2811/0673* (2013.01); *H05K 13/0061* (2013.01)

(58) Field of Classification Search
CPC ... H05K 13/04; H05K 13/08; H05K 13/0061; B65G 2811/0673; B65G 43/10
See application file for complete search history.

(56) References Cited

U.S. PATENT DOCUMENTS

| | | | | |
|---|---|---|---|---|
| 4,719,694 A * | 1/1988 | Herberich | ................ | G07C 3/00 198/341.03 |
| 5,680,936 A * | 10/1997 | Beers | ................. | H05K 13/0061 198/346.2 |
| 7,243,777 B2 * | 7/2007 | Reznik | ................... | B65G 47/71 198/370.02 |
| 7,270,227 B2 * | 9/2007 | Bender | ............... | B65G 47/648 198/358 |
| 8,413,577 B2 * | 4/2013 | Doyle | ............... | H05K 13/0061 101/114 |

FOREIGN PATENT DOCUMENTS

JP 2007-123503 A 5/2007

OTHER PUBLICATIONS

International Search Report issued Aug. 14, 2012 in PCT/JP2012/068070 filed Jul. 17, 2012.

* cited by examiner

*Primary Examiner* — Thomas Randazzo
(74) *Attorney, Agent, or Firm* — Oblon, McClelland, Maier & Neustadt, L.L.P.

(57) ABSTRACT

In a work system for substrates which includes plural working machines conveying circuit substrates through two paths and in which the circuit substrates are conveyed through the two paths from the working machine disposed upstream out of the plural working machines to the working machine disposed downstream, a circuit substrate of which the work result is not good is conveyed to the downstream working machine earlier than the circuit substrate of which the work result is good in a state in which the circuit substrate of which the work result is good and the circuit substrate of which the work result is not good are able to be conveyed to the downstream working machine by the upstream working machine.

13 Claims, 8 Drawing Sheets

WORK SYSTEM FOR SUBSTRATES AND WORKING MACHINE

TECHNICAL FIELD

The present invention relates to a work system for substrates in which a circuit substrate is conveyed from a working machine disposed upstream out of plural working machines to a working machine disposed downstream and a working machine constituting the work system.

BACKGROUND ART

In general, a work system for substrates includes plural working machines arranged in a line. A circuit substrate is conveyed from a working machine disposed upstream out of the plural working machines to a working machine disposed downstream. The plural working machines include a working machine that performs coating work such as paste soldering on a circuit substrate, a working machine that performs mounting work of electronic components on a circuit substrate, and an inspection machine that inspects the work results of a variety of work. In the system, when the inspection result of a circuit substrate inspected by the inspection machine is good, that is, when the circuit substrate inspected by the inspection machine is a normal circuit substrate (hereinafter, also referred to as "OK substrate"), the OK substrate is conveyed downstream through a predetermined path. On the other hand, when the inspection result of the circuit substrate inspected by the inspection machine is not good, that is, when the circuit substrate inspected by the inspection machine is an abnormal circuit substrate (hereinafter, also referred to as "NG substrate"), the NG substrate moves to a retracted position retracting from the predetermined path. An example of the system is described in the following patent literature.
    PTL 1: JP-A-2007-123503

SUMMARY

Technical Problem

In the work system for substrates described in the patent literature, since an NG substrate moves to the retracted position, an operator can perform a variety of work on the NG substrate at that position. On the other hand, as the work system for substrates, a system in which each working machine includes a pair of conveyance devices and a circuit substrate is conveyed by the pair of conveyance devices is known so as to achieve improvement in productivity. That is, a system in which circuit substrates are conveyed through two paths is present. In such a system, when an OK substrate is conveyed through one path of the two paths, an NG substrate in the other path of the two paths may not be moved to the retracted position. In this case, the timing of discharging the NG substrate to the retracted position is delayed and start of work on the NG substrate is delayed. As a result, work efficiency degrades. The present invention is made in consideration of the aforementioned circumstances and an object thereof is to provide a work system for substrates and a working machine with high work efficiency.

Solution to Problem

In order to achieve the aforementioned object, according to an embodiment of the present disclosure, there is provided a work system for substrates, including: a plurality of working machines that includes a pair of substrate conveyance devices for conveying circuit substrates through two paths and that is arranged in a line; and a control device that controls operations of the pair of substrate conveyance devices of each of the plurality of working machines, in which the circuit substrates are conveyed through the two paths from the working machine disposed upstream out of the plurality of working machines to the working machine disposed downstream, wherein the control device includes a substrate conveyance control unit that controls the operations of the pair of substrate conveyance devices of the upstream working machine and the downstream working machine so that a circuit substrate of which the work result is not good is conveyed to the downstream working machine earlier than a circuit substrate of which the work result is good in a state in which the circuit substrate of which the work result is good and the circuit substrate of which the work result is not good are able to be conveyed to the downstream working machine by the pair of substrate conveyance devices of the upstream working machine.

The work system for substrates according to an embodiment of the present disclosure is a work system for substrates wherein the downstream working machine has a standby position to which the conveyed circuit substrate of which the work result is not good is able to retract from the two paths.

The work system for substrates according to an embodiment of the present disclosure is a the work system for substrates including an alarm device that notifies an operator of conveyance of the circuit substrate of which the work result is not good to the downstream working machine before the circuit substrate of which the work result is not good is conveyed to the downstream working machine in a state in which the circuit substrate of which the work result is not good is able to be conveyed to the downstream working machine.

According to an embodiment of the present disclosure, there is provided a working machine including: a pair of substrate conveyance devices that conveys circuit substrates through two paths; and an individual control device that controls operations of the pair of substrate conveyance devices, wherein the individual control device includes an individual substrate conveyance control unit that controls the operations of the pair of substrate conveyance devices so that a circuit substrate of which the work result is not good is conveyed to the working machine earlier than a circuit substrate of which the work result is good in a state in which the circuit substrate of which the work result is good and the circuit substrate of which the work result is not good are able to be conveyed to the working machine by a working machine disposed upstream of the working machine.

Advantageous Effects

In the work system for substrates according to an embodiment of the present disclosure, the NG substrate is conveyed to the downstream working machine earlier than the OK substrate in the state in which the OK substrate and the NG substrate are able to be conveyed to the downstream working machine by the upstream working machine. Accordingly, for example, it is possible to rapidly move the NG substrate to the retracted position and thus to rapidly perform work on the NG substrate. As a result, it is possible to enhance work efficiency of the work system for substrates.

In the work system for substrates according to an embodiment of the present disclosure, the retracted position is formed in the downstream working machine. Accordingly, work can be performed on the NG substrate in the downstream working machine.

In the work system for substrates according to an embodiment of the present disclosure, the operator is notified of the conveyance of the NG substrate to the downstream working machine before the NG substrate is conveyed to the downstream working machine. Accordingly, the operator can prepare for work on the NG substrate and it is thus possible to further enhance work efficiency.

In the working machine according to an embodiment of the present disclosure, the NG substrate is conveyed to the working machine earlier than the OK substrate in the state in which the OK substrate and the NG substrate are able to be conveyed to the working machine by an upstream working machine. Accordingly, for example, it is possible to rapidly move the NG substrate to the retracted position and thus to rapidly perform work on the NG substrate. As a result, it is possible to enhance work efficiency of the working machine.

DESCRIPTION OF EMBODIMENTS

Hereinafter, examples of the present invention as modes for carrying out the present invention will be described in detail with reference to the accompanying drawings.
>Configuration of Electronic Component Mounting System≤

Figure 1:
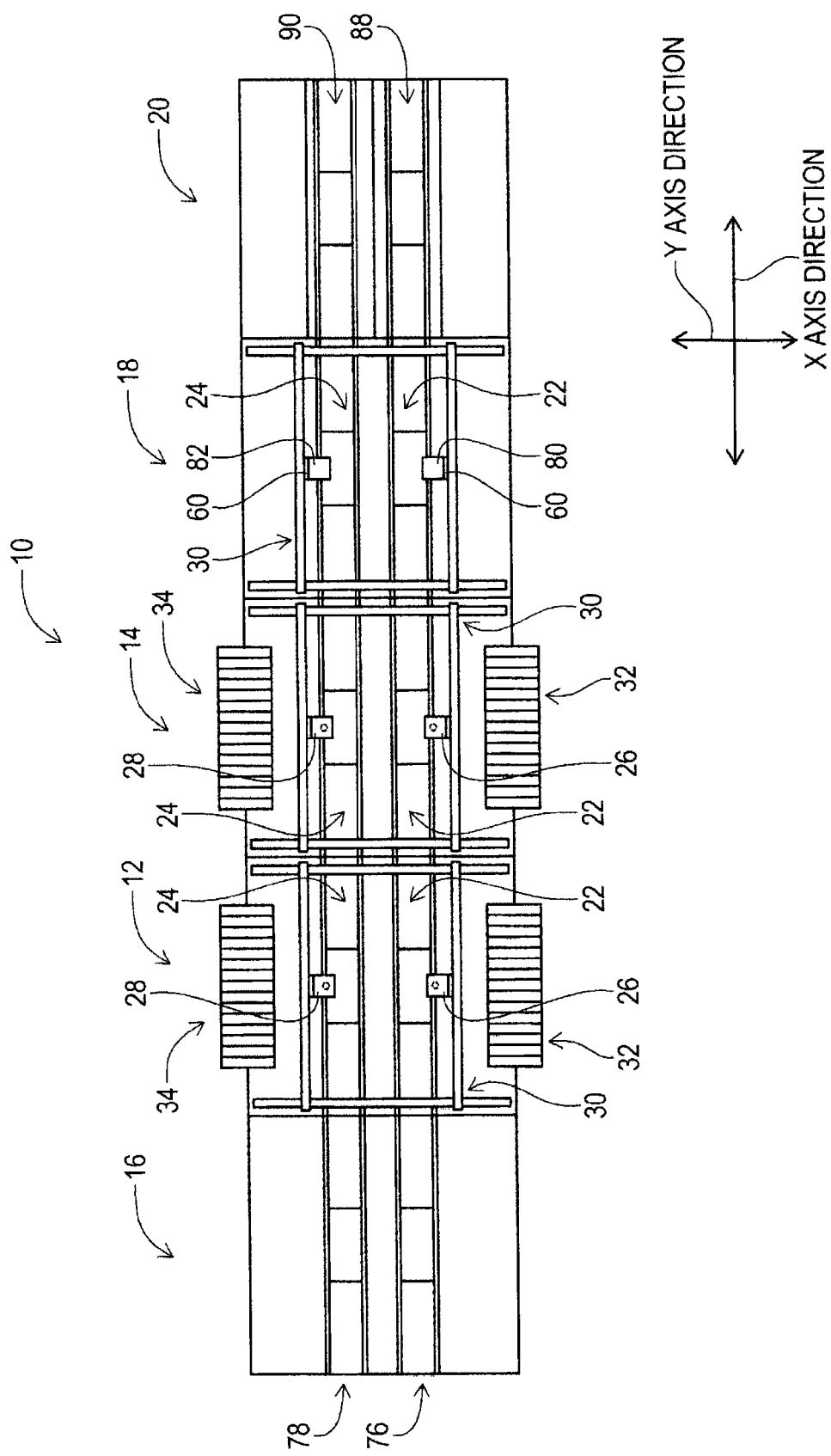
FIG. 1 is a diagram schematically illustrating a work system for substrates according to an embodiment of the present invention.

FIG. 1 illustrates an electronic component mounting system (hereinafter, also abbreviated to "mounting system") 10 as an example of the present invention. The mounting system 10 is a system for mounting an electronic circuit component (hereinafter, also abbreviated to "electronic component") on a circuit substrate. The mounting system 10 includes two electronic component mounting machines (hereinafter, also abbreviated to "mounting machine") 12 and 14, a solder printing machine 16, an inspection machine 18, and an NG substrate discharging machine 20.

Two mounting machines 12 and 14 are arranged in a line. The solder printing machine 16 is disposed on the upstream side of the mounting machine 12 disposed upstream out of the two mounting machines 12 and 14, and the inspection machine 18 is disposed on the downstream side of the mounting machine 14 disposed downstream out of the two mounting machines 12 and 14. The NG substrate discharging machine 20 is disposed downstream of the inspection machine 18. In the description below, the direction in which the mounting machines 12 and 14, the solder printing machine 16, the inspection machine 18, and the NG substrate discharging machine 20 are arranged is defined as an X axis direction and the horizontal direction perpendicular to the X axis direction is defined as a Y axis direction.

Figure 2:
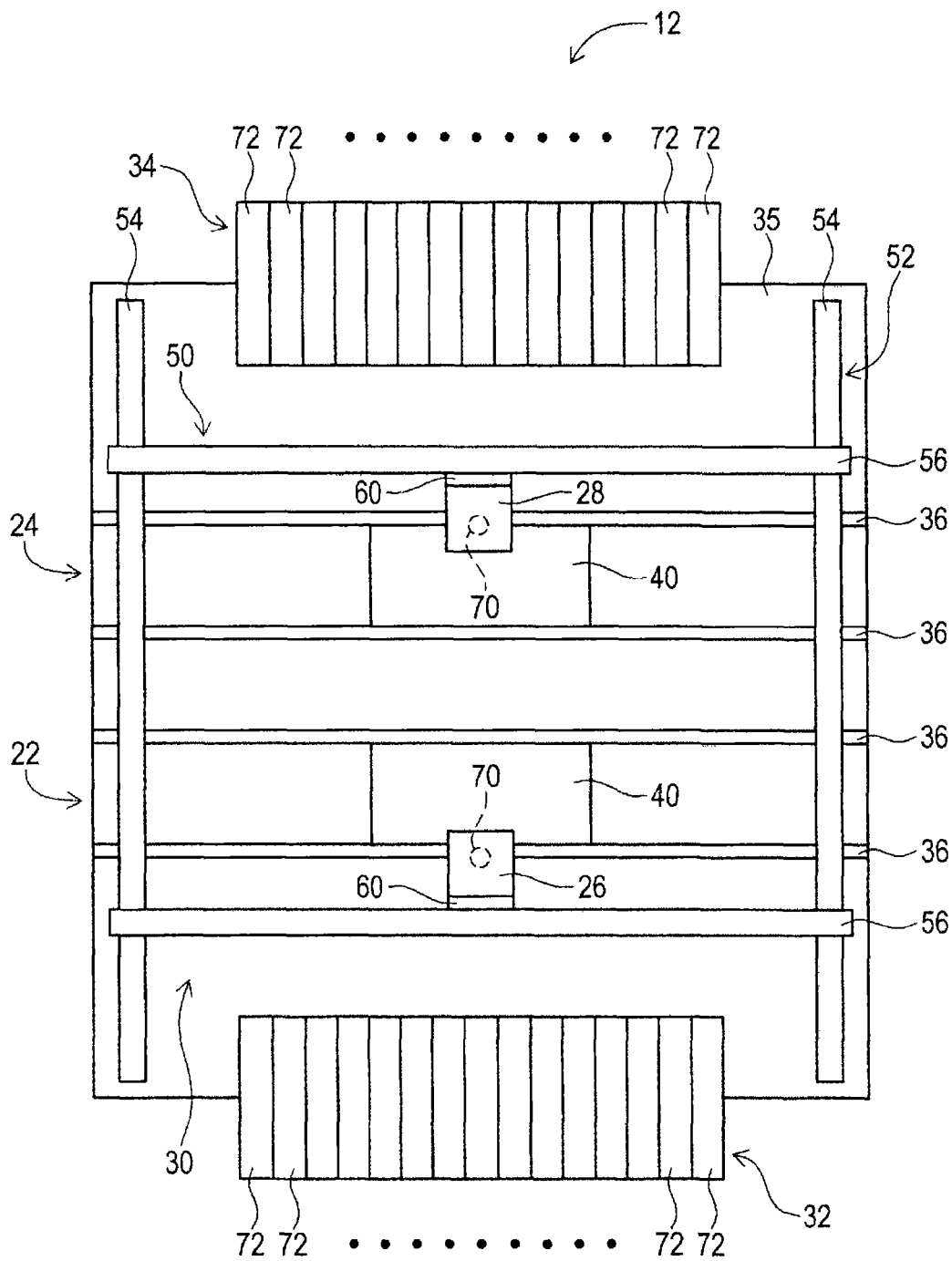
FIG. 2 is a diagram illustrating an electronic component mounting machine of the work system for substrates when viewed from the upper side.

First, the mounting machines 12 and 14 will be described below. The two mounting machines 12 and 14 have substantially the same configuration and thus the mounting machine 12 will be representatively described. As illustrated in FIG. 2, the mounting machine 12 includes a pair of conveyance devices 22 and 24, a pair of mounting heads 26 and 28, a mounting head moving device (hereinafter, also abbreviated to "moving device") 30, and a pair of supply devices 32 and 34.

The pair of conveyance devices 22 and 24 is arranged on a base 35 so as to be parallel to each other and to extend in the X axis direction. The pair of conveyance devices 22 and 24 has the same configuration and is arranged symmetrically in the Y axis direction. Each of the pair of conveyance devices 22 and 24 includes a pair of Conveyer belts 36 extending in the X axis direction and an electromagnetic motor (see FIG. 4) 38 circulating the conveyer belts 36. The circuit substrate 40 is supported by the pair of conveyer belts 36 and is conveyed in the X axis direction by the driving of the electromagnetic motor 38. Each of the pair of conveyance devices 22 and 24 includes a substrate support device (see FIG. 4) 42. The substrate support device 42 fixedly supports the circuit substrate 40 supported by the conveyer belts 36 at a predetermined position (position at which the circuit substrate 40 is illustrated in FIG. 2). When the conveyance device 22 and the conveyance device 24 are distinguished from each other, one conveyance device (conveyance device located on the lower side in FIG. 2) out of the pair of conveyance devices 22 and 24 is also referred to as a first conveyance device 22, and the other conveyance device (conveyance device located on the upper side in FIG. 2) is also referred to as a second conveyance device 24.

The moving device 30 includes an X axis-direction slide mechanism 50 and a Y axis-direction slide mechanism 52. The Y axis-direction slide mechanism 52 includes a pair of Y axis-direction guide rails 54 extending in the Y axis direction. On the other hand, the X axis-direction slide mechanism 50 includes a pair of X axis-direction guide rails 56 extending in the X axis direction. The pair of X axis-direction guide rails 56 is suspended on the pair of Y axis-direction guide rails 54. The Y axis-direction slide mechanism 52 includes an electromagnetic motor (see FIG. 4) 58 and the respective X axis-direction guide rails 56 are moved to an arbitrary position in the Y axis direction by the driving of the electromagnetic motor 58. Each X axis-direction guide rail 56 supports a slider 60 so as to be movable along its own axis line. The X axis-direction slide mechanism 50 includes an electromagnetic motor (see FIG. 4) 62 and the sliders 60 are moved to an arbitrary position in the X axis direction by the driving of the electromagnetic motor 62. The sliders 60 are provided with the mounting heads 26 and 28. By this structure, the mounting heads 26 and 28 are moved to an arbitrary position on the base 35 by the moving device 30. The mounting heads 26 and 28 are attached to and detached from the sliders 60 by one touch. Accordingly, as will be described later, the mounting heads can be replaced with other types of working heads such as a dispenser head and an inspection head.

Each of the pair of mounting heads 26 and 28 includes a suction nozzle 70 disposed on the bottom surface thereof. The suction nozzle 70 is connected to a positive and negative pressure supply device (not illustrated). Accordingly, the suction nozzle 70 suctions and supports an electronic component using a negative pressure and detaches the electronic component using a positive pressure. Each of the mounting heads 26 and 28 includes a nozzle lifting device (not illustrated) lifting the suction nozzle 70 and a nozzle rotating device (not illustrated) causing the suction nozzle 70 to rotate about an axis line. Accordingly, the position in the vertical direction and a support posture of the electronic component supported by the suction nozzle 70 are adjusted.

The pair of supply devices 32 and 34 is disposed on both sides in the Y axis direction of the base 35 with the pair of conveyance devices 22 and 24 interposed therebetween. Each of the supply devices 32 and 34 includes a tape feeder 72. The tape feeder 72 receives a taped component in a wound state. The taped component is a component in which an electronic component is taped. The tape feeder 72 sends the taped component through the use of a sending device (not illustrated). Accordingly, the supply devices 32 and 34 supplies an electronic component to a supply position by sending out the taped component. Each of the supply devices 32 and 34 can be attached to and detached from the base 35.

The solder printing machine 16 disposed upstream of the mounting machine 12 includes conveyance devices (see FIG. 1) 76 and 78 having the same structure as the conveyance devices 22 and 24 of the mounting machines 12 and 14, and a printing device (not illustrated). The printing machine is a machine that prints paste solder on a circuit substrate supported by the conveyance devices 76 and 78. Accordingly, the solder printing machine 16 prints the paste solder on the circuit substrate and conveys the circuit substrate on which the paste solder has been printed to the mounting machine 12. When the conveyance device 76 and the conveyance device 78 are distinguished from each other, as illustrated in FIG. 1, the conveyance device connected to the first conveyance device 22 of the mounting machine 12 out of the pair of conveyance devices 76 and 78 is referred to as a first conveyance device 76, and the conveyance device connected to the second conveyance device 24 of the mounting machine 12 is also referred to as a second conveyance device 78.

In the inspection machine 18 disposed downstream of the mounting machine 14, the mounting heads 26 and 28 of the mounting machines 12 and 14 are detached from the sliders 60 and inspection heads (see FIG. 1) 80 and 82 are attached to the sliders 60 instead of the mounting heads 26 and 28. In the inspection machine 18, the pair of supply devices 32 and 34 is detached from the base 35. That is, the inspection machine 18 includes a pair of conveyance devices 22 and 24, a moving device 30, and a pair of inspection heads 80 and 82. Each of the inspection heads 80 and 82 includes an inspection camera (see FIG. 4) 84, and it is inspected whether the mounting work of electronic components on the circuit substrates is good through the use of imaging with the inspection camera 84.

Figure 3:
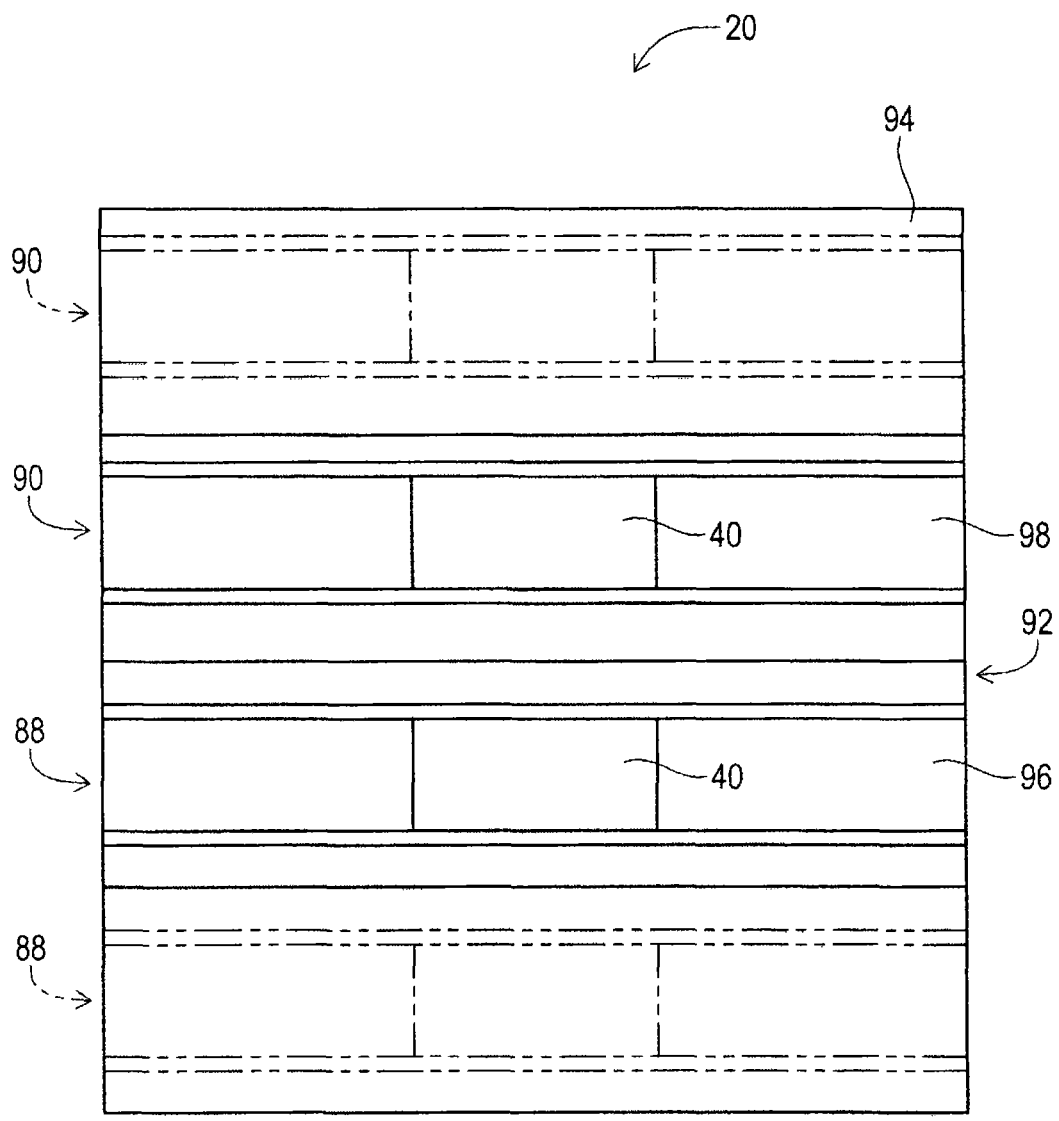
FIG. 3 is a diagram illustrating an NG substrate discharging machine of the work system for substrates when viewed from the upper side.

As illustrated in FIG. 3, the NG substrate discharging machine 20 disposed downstream of the inspection machine 18 includes conveyance devices 88 and 90 having the same structure as the conveyance devices 22 and 24 of the mounting machines 12 and 14. The conveyance devices 88 and 90 are disposed on a base 94 with a discharging mechanism 92 interposed therebetween. The discharging mechanism 92 includes two panels 96 and 98 having a substantially rectangular shape. Each of the panels 96 and 98 is disposed on the base 94 so that the length direction thereof is parallel to the X axis direction, and a pair of conveyance devices 88 and 90 is disposed on the top surfaces of the two panels 96 and 98. When the conveyance device 88 and the conveyance device 90 are distinguished from each other, the conveyance device (conveyance device located on the lower side in FIG. 3) connected to the first conveyance device 22 of the inspection machine 18 out of the pair of conveyance devices 88 and 90 is also referred to as a first conveyance device 88, and the other conveyance device (conveyance device located on the upper side in FIG. 3) connected to the second conveyance device 24 of the inspection machine 18 is also referred to as a second conveyance device 90, as illustrated in FIG. 1.

Figure 6:
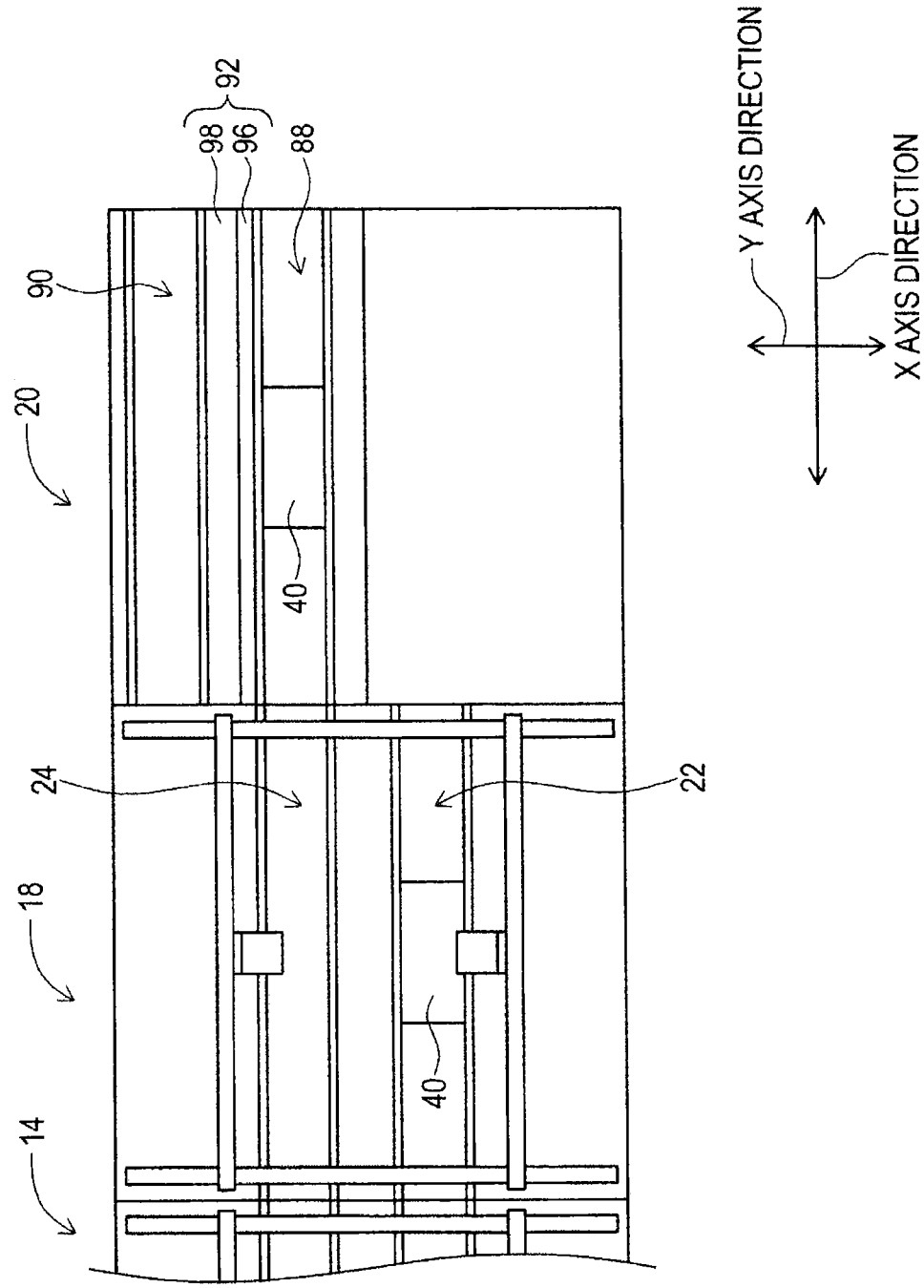
FIG. 6 is a diagram illustrating the inspection machine and the NG substrate discharging machine when viewed from the upper side when an NG substrate is conveyed from the inspection machine to the NG substrate discharging machine.
Figure 7:
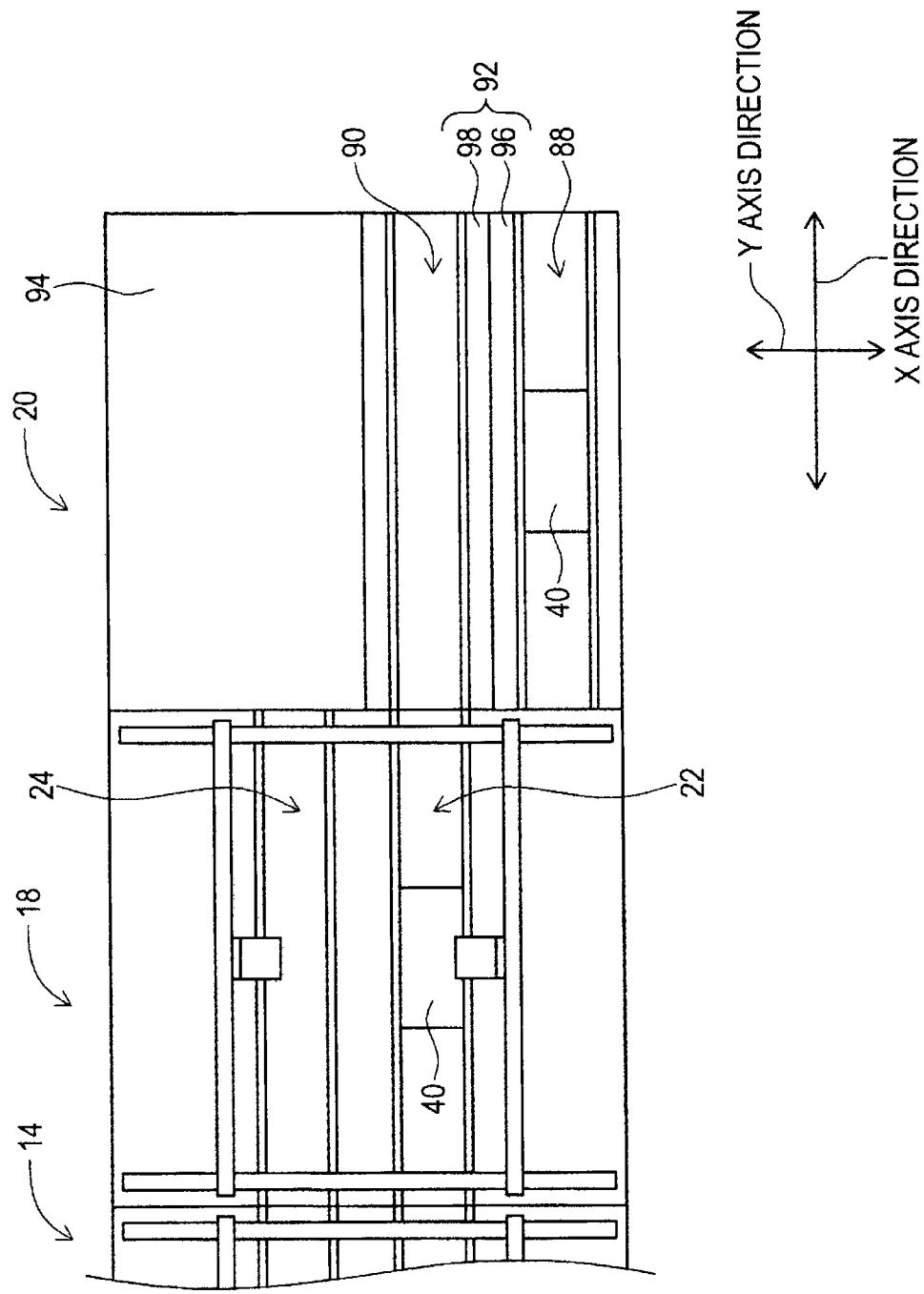
FIG. 7 is a diagram illustrating the inspection machine and the NG substrate discharging machine when viewed from the upper side when an NG substrate is moved to a retracted position.

Each of the panels 96 and 98 is slidable on the base 94 in the Y axis direction, and the discharging mechanism 92 includes an electromagnetic motor (see FIG. 4) 100 for causing the respective panels 96 and 98 to slide in the Y axis direction. Accordingly, the conveyance devices 88 and 90 can be made to slide in the Y axis direction. Specifically, by moving the first conveyance device 88 in the direction in which it is spaced apart from the second conveyance device 90, the first conveyance device 88 moves to the position indicated by a two-dot chain line in FIG. 3. Accordingly, the circuit substrate 40 supported by the first conveyance device 88 is discharged from the conveyance line. That is, the position of the first conveyance device 88 indicated by the two-dot chain line in FIG. 3 is the discharging position of the circuit substrate 40. On the other hand, by moving the second conveyance device 90 in the direction in which it is spaced apart from the first conveyance device 88, the second conveyance device 90 moves to the position indicated by a two-dot chain line in FIG. 3. By moving the first conveyance device 88 in the direction in which it gets close to the second conveyance device 90 when the second conveyance device 90 is being moved to the position indicated by the two-dot chain line in the drawing, the first conveyance device 88 moves to the position at which the second conveyance device 90 is indicated by a solid line in FIG. 3. Accordingly, the first conveyance device 88 is connected to the second conveyance device 24 of the inspection machine 18 as illustrated in FIG. 6. That is, the position of the second conveyance device 90 indicated by the two-dot chain line in FIG. 3 is a retracted position at which the first conveyance device 88 of the NG substrate discharging machine 20 is connected to the second conveyance device 24 of the inspection machine 18. By moving the second conveyance device 90 in the direction in which it gets close to the first conveyance device 88 when the first conveyance device 88 is being moved to the position indicated by the two-dot chain line in the drawing, the second conveyance device 90 is moved to the position at which the first conveyance device 88 is indicated by the solid line in FIG. 3. Accordingly, the second conveyance device 90 is connected to the first conveyance device 22 of the inspection machine 18 as illustrated in FIG. 7.

The NG substrate discharging machine 20 includes a signal tower (see FIG. 4) 101. The signal tower 101 displays the inspection result of the circuit substrate conveyed to the NG substrate discharging machine 20 by emitting light. Specifically, when a circuit substrate of which the inspection result is not good is conveyed to the NG substrate discharging machine 20, the signal tower 101 emits red light.

Figure 4:
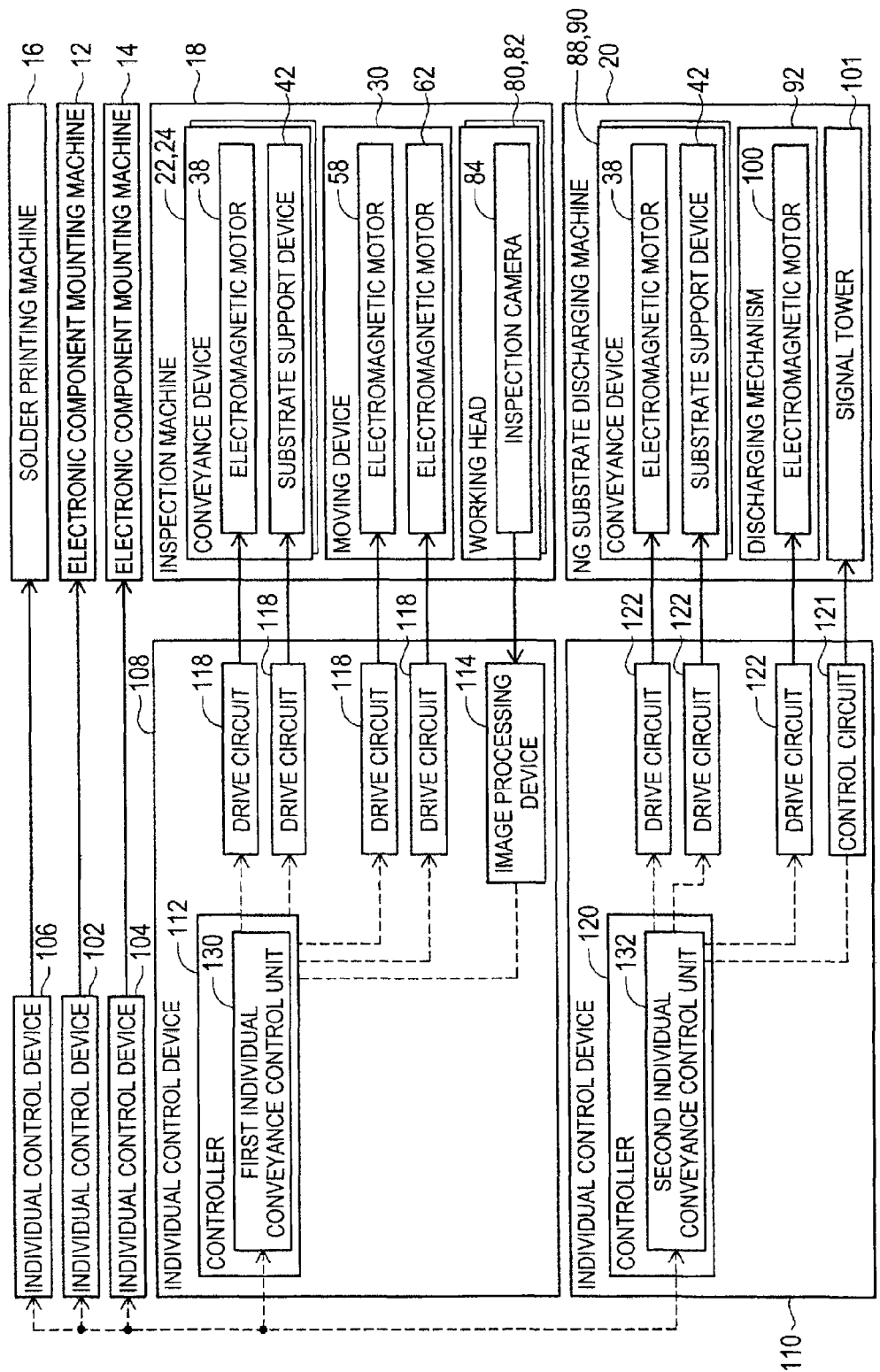
FIG. 4 is a block diagram illustrating individual control devices of respective working machines constituting the work system for substrates.

As illustrated in FIG. 4, the mounting system 10 includes plural individual control devices 102, 104, 106, 108, and 110 disposed to correspond to the mounting machines 12 and 14, the solder printing machine 16, the inspection machine 18, and the NG substrate discharging machine 20. The individual control device 108 disposed to correspond to the inspection machine 18 includes a controller 112, an image processing device 114, and plural drive circuits 118. The plural drive circuits 118 are connected to the electromagnetic motors 38, 58, and 62 and the substrate support device 42. The image processing device 114 is connected to the inspection camera 84, and processes image data acquired by the inspection camera 84. The controller 112 is constituted with a computer including a CPU, a ROM, and a RAM as a main body and is connected to the image processing device 114 and the plural drive circuits 118.

Accordingly, the operations of the conveyance devices 22 and 24, the moving device 30, and the like are controlled by the controller 112 and it is determined by the controller 112 whether the mounting work of an electronic component on the circuit substrate is good.

The individual control device 110 disposed to correspond to the NG substrate discharging machine 20 includes a controller 120, a control circuit 121, and plural drive circuits 122. The control circuit 121 is connected to the signal tower 101, and the plural drive circuits 122 are connected to the electromagnetic motors 38 and 100 and the substrate support device 42. The controller 120 is constituted with a computer including a CPU, a ROM, and a RAM as a main body and is connected to the control circuit 121 and the plural drive circuits 122. Accordingly, the operations of the conveyance devices 88 and 90 and the discharging mechanism 92 and the lighting of the signal tower 101 are controlled by the controller 120. The individual control devices 102, 104, and 106 disposed to correspond to the mounting machines 12 and 14 and the solder printing machine 16 include a controller and drive circuits and have a configuration similar to the controller and the drive circuits which have been described above, and detailed description and illustration thereof will not be repeated. The controllers 112 and 120 of the plural individual control devices 102, 104, 106, 108 and 110 are connected to each other, and information, commands, and the like are transmitted and received between the controllers 112 and 120.

>Control of Mounting System<

In the mounting system 10 having the aforementioned configuration, circuit substrates are conveyed from the solder printing machine 16 disposed most upstream to the NG substrate discharging machine 20 disposed most downstream. The conveyed circuit substrates are subjected to work by the solder printing machine 16 and the mounting machines 12 and 14. It is inspected by the inspection machine 18 whether the work by the working machines is good, and the circuit substrate of which the inspection result is not good is discharged by the NG substrate discharging machine 20.

Specifically, the circuit substrates are conveyed to a working position by the first conveyance device 76 and the second conveyance device 78 of the solder printing machine 16, and are supported at the working position by the substrate support device 42. Then, paste solder is printed on the circuit substrates by the printing machine of the solder printing machine 16. Then, the circuit substrates on which the paste solder has been printed are conveyed to the mounting machine 12 by the conveyance devices 76 and 78.

The circuit substrates conveyed from the solder printing machine 16 to the mounting machine 12 is conveyed to a working position by the first conveyance device 22 and the second conveyance device 24 of the mounting machine 12, and is supported at the working position by the substrate support device 42. Then, the mounting heads 26 and 28 move to supply positions of the supply devices 32 and 34 by the moving device 30. Electronic components fed from the supply devices 32 and 34 are suctioned and supported by the mounting heads 26 and 28. Subsequently, the mounting heads 26 and 28 move onto the circuit substrates by the moving device 30 and the electronic components are mounted on the circuit substrates. The circuit substrates on which the electronic components have been mounted are conveyed to the mounting machine 14 by the conveyance devices 22 and 24.

Then, in the mounting machine 14, the same work as in the mounting machine 12 is performed, whereby the mounting work of electronic components on the circuit substrates is completed. The circuit substrates on which the mounting work of electronic components has been completed are conveyed to the inspection machine 18 by the conveyance devices 22 and 24 of the mounting machine 14. In the inspection machine 18, the circuit substrates are conveyed to a working position by the first conveyance device 22 and the second conveyance device 24 of the inspection machine 18, and are supported at the working position by the substrate support device 42. Then, the inspection heads 80 and 82 move onto the circuit substrates by the moving device 30, and the circuit substrates are imaged by the inspection camera 84. Image data acquired by the inspection camera 84 is processed by the image processing device 114, and information on the mounting state of the electronic components on the circuit substrates is acquired. Inspection work on the circuit substrates on which the electronic components have been mounted is performed on the basis of the information. Then, the circuit substrates subjected to the inspection work are conveyed to the NG substrate discharging machine 20 by the conveyance devices 22 and 24.

When the inspection result of a circuit substrate inspected by the inspection machine 18 is good, that is, when the circuit substrate inspected by the inspection machine 18 is a normal circuit substrate (hereinafter, also referred to as "OK substrate"), the OK substrate is conveyed downstream by the first conveyance device 88 and the second conveyance device 90 of the NG substrate discharging machine 20, and is discharged from the end of the respective conveyance devices 88 and 90. Accordingly, in the mounting system 10, the circuit substrates are conveyed through two paths and an OK substrate is manufactured in each path.

Figure 5:
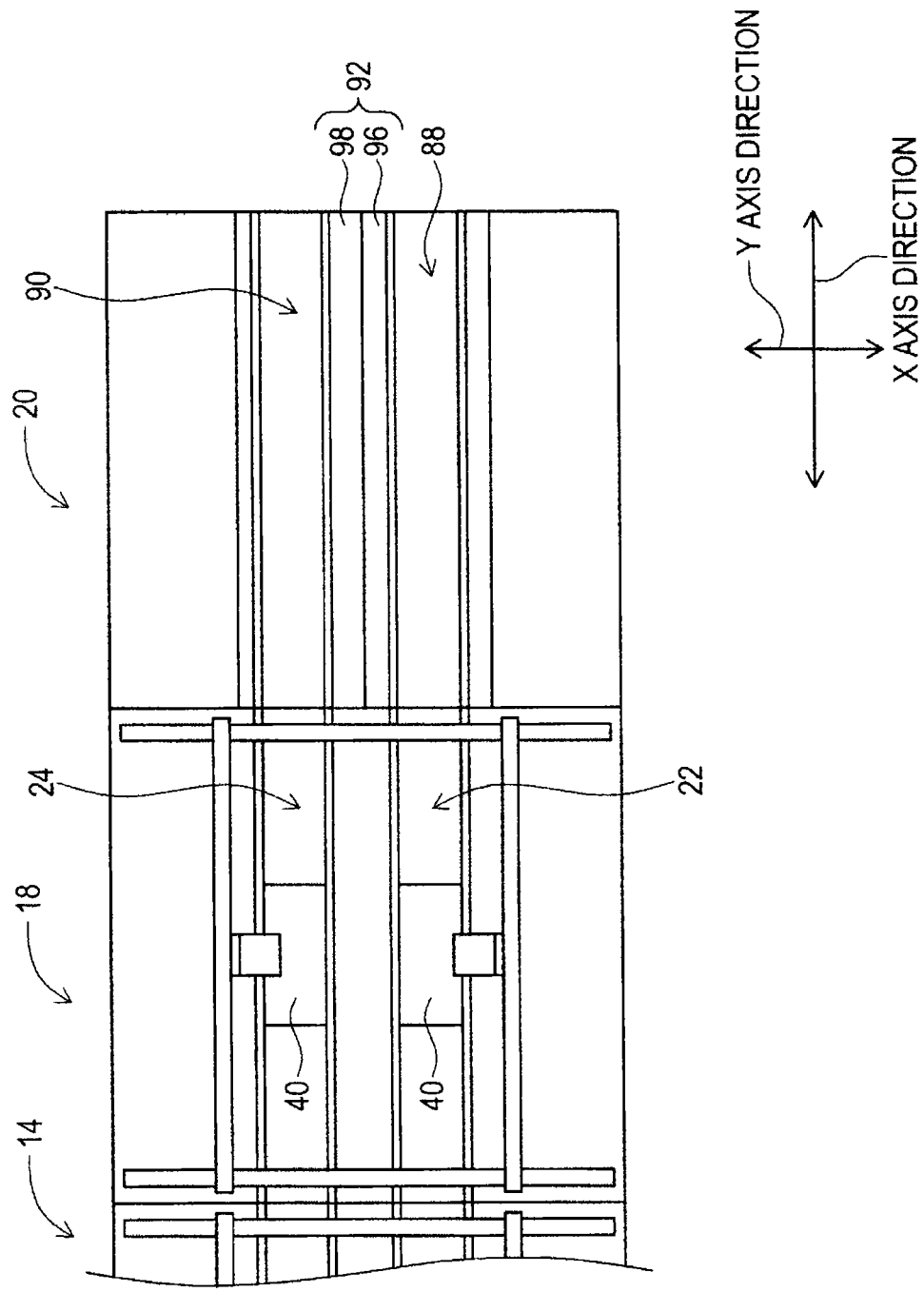
FIG. 5 is a diagram illustrating an inspection machine and the NG substrate discharging machine of the work system for substrates when viewed from the upper side.

On the other hand, when inspection result of a circuit substrate inspected by the inspection machine 18 is not good, that is, when the circuit substrate inspected by the inspection machine 18 is an abnormal circuit substrate (hereinafter, also referred to as "NG substrate"), the NG substrate is discharged to the retracted position by the first conveyance device 88 of the NG substrate discharging machine 20. Specifically, for example, as illustrated in FIG. 5, a case is considered in which two circuit substrates 40 are supported by the two conveyance devices 22 and 24 in the inspection machine 18, one of two circuit substrates 40 is an NG substrate, and the other thereof is an OK substrate. In addition, it is assumed that the circuit substrate 40 supported by the first conveyance device 22 of the inspection machine 18 is an OK substrate and the circuit substrate 40 supported by the second conveyance device 24 is an NG substrate.

In this case, information indicating that the circuit substrate 40 supported by the second conveyance device 24 of the inspection machine 18 is an NG substrate is transmitted from the controller 112 of the inspection machine 18 to the controller 120 of the NG substrate discharging machine 20. That is, information indicating that the NG substrate can be sent to the NG substrate discharging machine 20 by the second conveyance device 24 of the inspection machine 18 is transmitted. Then, the NG substrate discharging machine 20 receives the information and causes the signal tower 101 to emit red light on the basis of the received information. The NG substrate discharging machine 20 moves the first conveyance device 88 of the NG substrate discharging machine 20 through the use of the discharging mechanism 92 so that the NG substrate can retract to the retracted position on the basis of the information.

Specifically, the second conveyance device 90 in the state illustrated in FIG. 5 is moved in the direction (upward in the drawing) in which it is spaced apart from the first conveyance device 88 by the discharging mechanism 92. Accordingly, the connection between the second conveyance device 90 of the NG substrate discharging machine 20 and the second conveyance device 24 of the inspection machine 18 is released. Then, the first conveyance device 88 is moved to the position of the second conveyance device 90 in the state illustrated in FIG. 5. Accordingly, the first conveyance device 88 of the NG substrate discharging machine 20 is connected to the second conveyance device 24 of the inspection machine 18 as illustrated in FIG. 6. In this state, the second conveyance device 24 of the inspection machine 18 and the first conveyance device 88 of the NG substrate discharging machine 20 are driven and the NG substrate is conveyed to the working position of the first conveyance device 88. Then, at that position, the NG substrate is supported by the substrate support device 42 of the first conveyance device 88.

Subsequently, the first conveyance device 88 supporting the NG substrate is moved in the direction (downward in the drawing) in which it is spaced apart from the second conveyance device 90, and is moved to the end of the base 94 of the NG substrate discharging machine 20 in the Y axis direction as illustrated in FIG. 7. The position of the end of the base 94 is the retracted position and the NG substrate is discharged to the retracted position by the operation of the discharging mechanism 92. In the mounting system 10, an operator generally works on one side (the lower side in the drawing) in the Y axis direction of the mounting system 10, and checking work with eyes, NG substrate removing work, and the like are performed on the NG substrate discharged to the retracted position.

As illustrated in FIG. 7, the second conveyance device 90 of the NG substrate discharging machine 20 is moved in the direction (downward in the drawing) in which it gets close to the first conveyance device 88 so that the OK substrate supported by the first conveyance device 22 of the inspection machine 18 can be discharged from the mounting system 10. Accordingly, the second conveyance device 90 of the NG substrate discharging machine 20 is connected to the first conveyance device 22 of the inspection machine 18. In this state, the first conveyance device 22 of the inspection machine 18 and the second conveyance device 90 of the NG substrate discharging machine 20 are driven and the OK substrate is discharged from the end of the second conveyance device 90.

Figure 8:
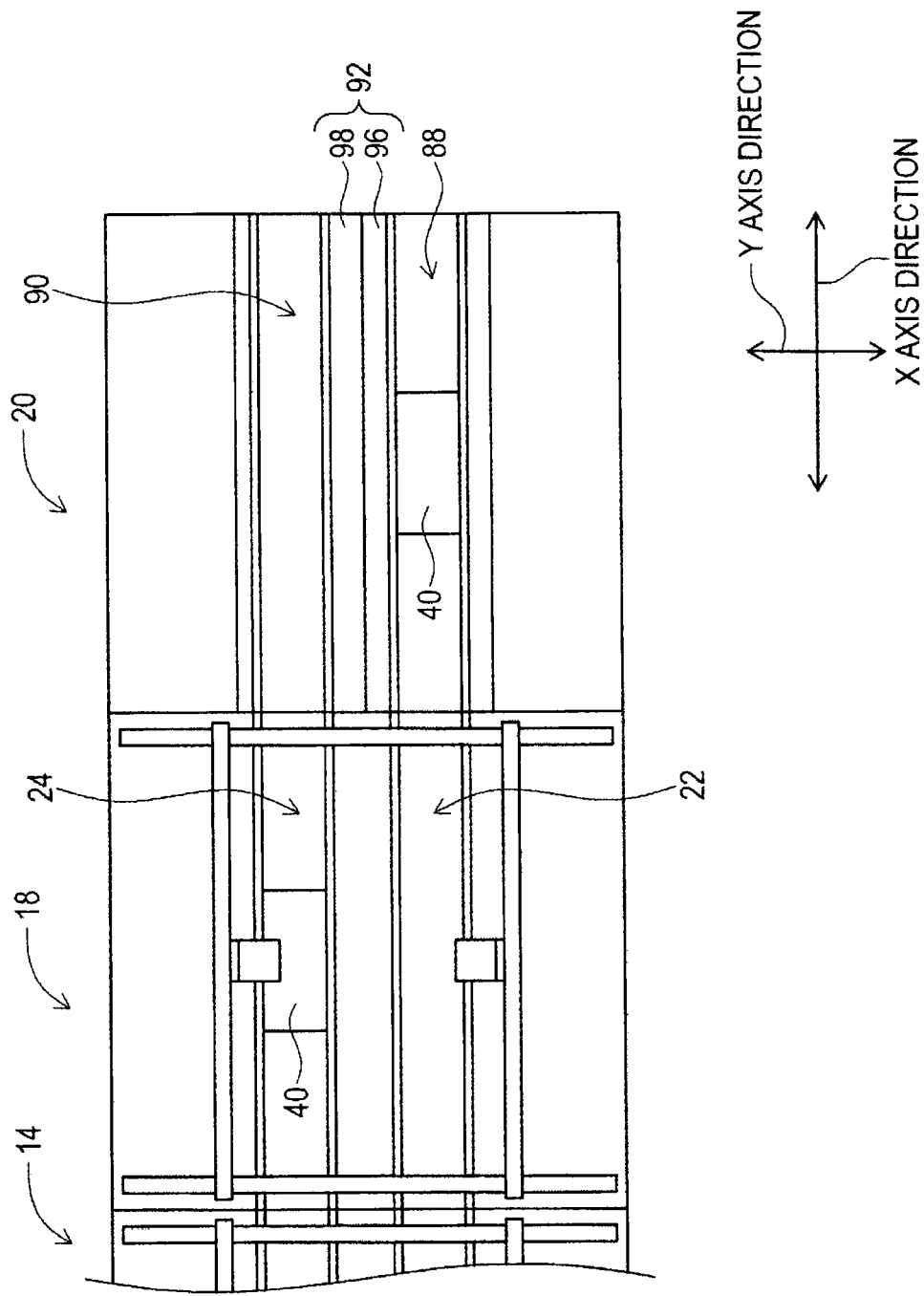
FIG. 8 is a diagram illustrating the inspection machine and the NG substrate discharging machine when viewed from the upper side when an OK substrate is conveyed to the NG substrate discharging machine earlier than an NG substrate.

In this way, in the mounting system 10, the NG substrate is conveyed to the NG substrate discharging machine 20 earlier than the OK substrate in the state in which the OK substrate and the NG substrate can be conveyed from the inspection machine 18 to the NG substrate discharging machine 20. On the other hand, a case will be considered in which the OK substrate is conveyed to the NG substrate discharging machine 20 earlier than the NG substrate in the state in which the OK substrate and the NG substrate can be conveyed from the inspection machine 18 to the NG substrate discharging machine 20. In this case, the OK substrate supported by the first conveyance device 22 of the inspection machine 18 is conveyed to the first conveyance device 88 of the NG substrate discharging machine 20 as illustrated in FIG. 8 and is discharged from the NG substrate discharging machine 20 by the first conveyance device 88. Accordingly, the NG substrate is left in a state in which it is supported by the second conveyance device 24 of the inspection machine 18 while the OK substrate is being conveyed. That is, when the OK substrate is conveyed to the NG substrate discharging machine 20 earlier than the NG substrate, the timing of discharging the NG substrate to the retracted position is delayed and the start of work on the NG substrate is delayed.

In this way, in the mounting system 10, since the NG substrate is conveyed to the NG substrate discharging machine 20 earlier than the OK substrate, the NG substrate can be rapidly discharged to the retracted position and the work on the NG substrate by an operator can be rapidly started. The controller 112 of the inspection machine 18 includes a first individual conveyance control unit (see FIG. 4) 130 as a functional unit for conveying the NG substrate from the inspection machine 18 to the NG substrate discharging machine 20 earlier than the OK substrate. The controller 120 of the NG substrate discharging machine 20 includes a second individual conveyance control unit (see FIG. 4) 132 as a functional unit for conveying the NG substrate to the NG substrate discharging machine 20 earlier than the OK substrate.

In the mounting system 10, the signal tower 101 emits red light on the basis of the information indicating that the NG substrate can be conveyed to the NG substrate discharging machine 20 before the NG substrate is conveyed to the NG substrate discharging machine 20. That is, before the NG substrate is conveyed to the NG substrate discharging machine 20, an operator is notified that the NG substrate is conveyed to the NG substrate discharging machine 20. Accordingly, the operator can prepare for work on the NG substrate or the like and it is thus possible to enhance work efficiency.

In the aforementioned example, the electronic component mounting system 10 is an example of the work system for substrates. The electronic component mounting machines 12 and 14, the solder printing machine 16, the inspection machine 18, and the NG substrate discharging machine 20 are examples of the plural working machines. The inspection machine 18 is an example of the upstream working machine and the NG substrate discharging machine 20 is an example of the downstream working machine. The conveyance devices, 22, 24, 76, 78, 88, and 90 are examples of the substrate conveyance device. The individual conveyance control devices 102, 104, 106, 108, and 110 are examples of the control device. The first individual conveyance control unit 130 and the second individual conveyance control unit 132 are examples of the substrate conveyance control unit. The signal tower 101 is an example of the alarm device. The NG substrate discharging machine 20 is an example of the working machine and the individual control device 110 of the NG substrate discharging machine 20 is an example of the individual control device.

The present invention is not limited to the aforementioned example, but can be modified in various forms including various modifications and improvements on the knowledge of those skilled in the art. Specifically, for example, the inspection machine 18 is employed as the upstream working machine in the aforementioned example, but various working machines may be employed. Specifically, for example, a solder printing machine, a mounting machine, or the like may be employed, or a working machine including only a conveyance device may be employed.

A circuit substrate on which an electronic component is not appropriately mounted is employed as the NG substrate in the aforementioned example, but a circuit substrate of which various work results are not good may be employed. Specifically, for example, a circuit substrate on which printing or coating work of solder, adhesive, or the like is not appropriately performed may be employed as the NG substrate.

In the aforementioned example, various commands, a variety of information, and the like are transmitted and received between the individual control devices 102, 104, 106, 108, and 110, but a general control device may be provided and a variety of commands, a variety of information, and the like maybe transmitted from the general control device to the plural individual control devices 102, 104, 106, and 108. In this case, the general control device is provided with a substrate conveyance control unit.

REFERENCE SIGNS LIST

10: electronic component mounting system (work system for substrates)
12: electronic component mounting machine (working machine)
14: electronic component mounting machine (working machine)
16: solder printing machine (working machine)
18: inspection machine (working machine) (upstream working machine)
20: NG substrate discharging machine (working machine) (downstream working machine)
22: conveyance device (substrate conveyance control)
24: conveyance device (substrate conveyance control)
76: conveyance device (substrate conveyance control)
78: conveyance device (substrate conveyance control)
88: conveyance device (substrate conveyance control)
90: conveyance device (substrate conveyance control)
101: signal tower (alarm device)
102: individual control device (control device)
104: individual control device (control device)
106: individual control device (control device)
108: individual control device (control device)
110: individual control device (control device)
130: first individual conveyance control unit (substrate conveyance control unit)
132: second individual conveyance control unit (substrate conveyance control unit) (individual substrate conveyance control unit)

The invention claimed is:

1. A work system for substrates, comprising:
a plurality of working machines arranged in a line that each include a pair of substrate conveyance devices for conveying circuit substrates through two distinct working paths parallel to each other along a horizontal working plane of the plurality of working machines; and
a control device configured to control operations of the pair of substrate conveyance devices of each of the plurality of working machines so that the circuit substrates are conveyed through the two distinct working paths from a working machine disposed upstream out of the plurality of working machines to a working machine disposed downstream out of the plurality of working machines,
wherein the control device includes a substrate conveyance control unit configured to control the operations of the pair of substrate conveyance devices of the upstream working machine and the downstream working machine so that a circuit substrate of which a work result is not good is conveyed to the downstream working machine earlier than a circuit substrate of which a work result is good in a state in which both the circuit substrate of which a work result is good and the circuit substrate of which the work result is not good are able to be conveyed to the downstream working machine via separate of the two distinct working paths by the pair of substrate conveyance devices of the upstream working machine.

2. The work system for substrates according to claim 1, wherein the downstream working machine has a standby position to which the conveyed circuit substrate of which the work result is not good is able to retract from the two distinct working paths.

3. The work system for substrates according to claim 1, further comprising an alarm device configured to notify an operator of conveyance of the circuit substrate of which the work result is not good to the downstream working machine before the circuit substrate of which the work result is not good is conveyed to the downstream working machine in a state in which the circuit substrate of which the work result is not good is able to be conveyed to the downstream working machine via its respective working path of the two distinct working paths.

4. The work system for substrates according to claim 1, wherein the substrate conveyance control unit is configured to control the operations of the pair of substrate conveyance devices of the upstream working machine and the downstream working machine so that the circuit substrate of which the work result is not good is conveyed to the downstream working machine earlier than the circuit substrate of which the work result is good in a state in which both the circuit substrate of which the work result is good and the circuit substrate of which the work result is not good are able to be simultaneously conveyed to the downstream working machine via separate of the two distinct working paths by the pair of substrate conveyance devices of the upstream working machine.

5. The work system for substrates according to claim 1, wherein the substrate conveyance control unit is configured to control the operations of the pair of substrate conveyance devices of the upstream working machine so that the one of the pair of substrate conveyance devices of the upstream working machine that conveys the circuit substrate of which the work result is not good conveys the circuit substrate of which the work result is not good to the downstream working machine earlier than the one of the pair of substrate conveyance devices of the upstream working machine that conveys the circuit substrate of which the work result is good conveys the circuit substrate of which the work result is good to the downstream working machine.

6. The work system for substrates according to claim 1, wherein the substrate conveyance control unit is configured to control the downstream working machine so that the one of the pair of substrate conveyance devices of the downstream working machine that is an operator side substrate conveyance device is aligned with the one of the pair of substrate conveyance devices of the upstream working machine that conveys the circuit substrate of which the work result is not good.

7. The work system for substrates according to claim 6, wherein the substrate conveyance control unit is configured to shift the pair of substrate conveyance devices of the downstream working machine along the horizontal working plane in a direction perpendicular to the two distinct working paths to align the one of the pair of substrate conveyance devices of the downstream working machine that is the operator side substrate conveyance device with the one of the pair of substrate conveyance devices of the upstream working machine that conveys the circuit substrate of which the work result is not good.

8. The work system for substrates according to claim 7, further comprising a motor, wherein the substrate conveyance control unit is configured to drive the motor to shift the pair of substrate conveyance devices of the downstream working machine along the horizontal working plane in the direction perpendicular to the two distinct working paths.

9. A working machine comprising:
a pair of substrate conveyance devices that conveys circuit substrates through two distinct working paths parallel to each other along a horizontal working plane of the working machine; and
an individual control device configured to control operations of the pair of substrate conveyance devices,
wherein the individual control device includes an individual substrate conveyance control unit configured to control the operations of the pair of substrate conveyance devices so that a circuit substrate of which a work result is not good is conveyed to the working machine earlier than a circuit substrate of which a work result is good in a state in which both the circuit substrate of which the work result is good and the circuit substrate of which the work result is not good are able to be conveyed to the working machine via separate of the two distinct working paths by another working machine disposed upstream of the working machine.

10. The working machine according to claim 9, wherein the individual substrate conveyance control unit is configured to control the operations of the pair of substrate conveyance devices so that the circuit substrate of which the work result is not good is conveyed to the working machine earlier than the circuit substrate of which the work result is good in the state in which both the circuit substrate of which the work result is good and the circuit substrate of which the work result is not good are able to be simultaneously conveyed to the working machine via separate of the two distinct working paths by another working machine disposed upstream of the working machine.

11. The working machine according to claim 9, wherein the individual substrate conveyance control unit is configured to control the working machine so that the one of the pair of substrate conveyance devices that is an operator side substrate conveyance device is aligned with the one of a pair of substrate conveyance devices of the another working machine that conveys the circuit substrate of which the work result is not good.

12. The working machine according to claim 11, wherein the individual substrate conveyance control unit is configured to shift the pair of substrate conveyance devices along the horizontal working plane in a direction perpendicular to the two distinct working paths to align the one of the pair of substrate conveyance devices that is the operator side substrate conveyance device with the one of the pair of substrate conveyance devices of the another working machine that conveys the circuit substrate of which the work result is not good.

13. The working machine according to claim 12, further comprising a motor, wherein the individual substrate conveyance control unit is configured to drive the motor to shift the pair of substrate conveyance devices along the horizontal working plane in the direction perpendicular to the two distinct working paths.

* * * * *